US011711984B2

(12) United States Patent
Lagally et al.

(10) Patent No.: US 11,711,984 B2
(45) Date of Patent: Jul. 25, 2023

(54) SUPERCONDUCTING BILAYERS OF TWO-DIMENSIONAL MATERIALS WITH INTEGRATED JOSEPHSON JUNCTIONS

(71) Applicants: Wisconsin Alumni Research Foundation, Madison, WI (US); University of Hamburg, Hamburg (DE)

(72) Inventors: Max G. Lagally, Madison, WI (US); Robert H. Blick, Hamburg (DE)

(73) Assignee: Wisconsin Alumni Research Foundation, Madison, WI (US)

( * ) Notice: Subject to any disclaimer, the term of this patent is extended or adjusted under 35 U.S.C. 154(b) by 187 days.

(21) Appl. No.: 17/366,195

(22) Filed: Jul. 2, 2021

(65) Prior Publication Data

US 2022/0005998 A1    Jan. 6, 2022

Related U.S. Application Data

(60) Provisional application No. 63/047,948, filed on Jul. 3, 2020.

(51) Int. Cl.
*H10N 60/80*     (2023.01)
*H10N 60/12*     (2023.01)
*H10N 60/10*     (2023.01)
*H10N 60/85*     (2023.01)
*H01P 3/00*      (2006.01)

(52) U.S. Cl.
CPC .......... *H10N 60/805* (2023.02); *H01P 3/003* (2013.01); *H10N 60/12* (2023.02); *H10N 60/128* (2023.02); *H10N 60/855* (2023.02)

(58) Field of Classification Search
CPC .... H10N 60/805; H10N 60/12; H10N 60/128; H10N 60/0912; H10N 60/85
See application file for complete search history.

(56) References Cited

U.S. PATENT DOCUMENTS

| 5,582,877 | A  | 12/1996 | Nagamachi et al. |
| 6,207,067 | B1 | 3/2001  | Yutani et al. |
| 9,383,208 | B2 | 7/2016  | Mohanty |
| 9,799,817 | B2 | 10/2017 | Fong et al. |
| 2019/0024554 | A1 | 8/2019 | Herr |

(Continued)

FOREIGN PATENT DOCUMENTS

| KR | 10-0365984    | 7/2003 |
| WO | WO2019/183105 | 9/2019 |

OTHER PUBLICATIONS

International Search Report and Written Opinion for PCT/US2021/040224, dated Apr. 14, 2022.

(Continued)

*Primary Examiner* — Matthew L Reames
(74) *Attorney, Agent, or Firm* — Bell & Manning, LLC

(57) ABSTRACT

Josephson junctions (JJ) based on bilayers of azimuthally misaligned two-dimensional materials having superconducting states are provided. Also provided are electronic devices and circuits incorporating the JJs as active components and methods of using the electronic devices and circuits. The JJs are formed from bilayers composed of azimuthally misaligned two-dimensional materials having a first superconducting segment and a second superconducting segment separated by a weak-link region that is integrated into the bilayer.

18 Claims, 3 Drawing Sheets

(56) References Cited

U.S. PATENT DOCUMENTS

2020/0052183 A1 2/2020 Shainline et al.
2021/0217946 A1* 7/2021 Lee .................... H10N 60/0912

OTHER PUBLICATIONS

Luong et al., "Gram-scale bottom-up flash graphene synthesis," *Nature*, vol. 577, Jan. 30, 2020, pp. 647-653.
Prof. Dr. Christian Schonenberger, Swiss Nanoscience Institute, PhD fellowship "Superconductivity in Twisted Bilayer of Graphene" Universitat Basel, Sep. 2019.
Alex I. Braginski, "Superconductor Electronics: Status and Outlook," *Journal of Superconductivity and Novel Magnetism*, (2019) 32:23-44.
Kraft et al., "Tailoring supercurrent confinement in graphene bilayer weak links," *Nature Communications*, (2018)9:1722.
Lee, GH., Efetov, D.K., Jung, W. et al. Graphene-based Josephson junction microwave bolometer. Nature 586, 42-46 (2020). https://doi.org/10.1038/s41586-020-2752-4.
Chao-Xing Liu "Unconventional superconductivity in bilayer transition metal dichalcogenides," Phys. Rev. Lett. 118, 087001—Published Feb. 21, 2017.
Rodan-Legrain et al., "Fully Tunable Magic Angle Twisted Bilayer Graphene Josephson Junction," Bulletin of the American Physical Society, APS March Meeting 2020, vol. 65, No. 1.
Walsh et al., "Graphene-based Josephson junction single photon detector," Phys. Rev. Applied 8, 024022—Published Aug. 24, 2017.
Wollman et al., "Experimental Determinatino of the Superconducting Pairing State in YBCO from the Phase Coherence of YBCO—Pb dcSQUIDs," *Physical Review Letters*, vol. 71, No. 13, Sep. 27, 1993, 4 pages.
Zhang et al., "Resistively detected microwave absorption in highly twisted bilayer graphene," APS March Meeting 2019, 2 pages.

* cited by examiner

SUPERCONDUCTING BILAYERS OF TWO-DIMENSIONAL MATERIALS WITH INTEGRATED JOSEPHSON JUNCTIONS

CROSS-REFERENCE TO RELATED APPLICATIONS

The present application claims priority to U.S. provisional patent application No. 63/047,948 filed on Jul. 3, 2020, the entire disclosure of which is incorporated herein by reference.

REFERENCE TO GOVERNMENT RIGHTS

This invention was made with government support under DE-FG02-03ER46028 awarded by the US Department of Energy. The government has certain rights in the invention.

BACKGROUND

Recent developments in superconducting qubits, which form the essential building blocks of quantum computers, have brought Josephson junctions to the forefront of research and applications, because these junctions are a central element in qubits. Josephson junctions are composed of two superconductors separated by a thin or narrow non-superconducting barrier or "weak link". Currently, Josephson junctions are fabricated by growing or depositing a barrier material, such as aluminum oxide, lead oxide, or even graphene, in a gap between two superconducting leads. However, the carrier densities for Josephson junctions that utilize thin layers of aluminum as a weak-link are not gate-tunable. Gate voltage-tunable Josephson junctions have been fabricated using materials such as single-layer graphene as a barrier between superconducting leads, but the tunability of these junctions has proven to be limited.

SUMMARY

Josephson junctions, devices that incorporate the Josephson junctions, such as microwave detectors, and methods of operating the devices are provided.

One embodiment of a Josephson junction includes: a superconducting bilayer comprising two azimuthally misaligned layers of a two-dimensional material, wherein the superconducting bilayer comprises a first segment and a second segment; and a weak-link region separating the first segment from the second segment, wherein the weak-link region is an integral part of the superconducting bilayer. The weak-link region may be provided by, for example, a concentration of lattice defects or an out-of-plane bend.

One embodiment of a Josephson junction-based device includes: a Josephson junction of a type described above; a first electrode in electrical communication with the first segment; a second electrode in electrical communication with the second segment; a gate dielectric underlying the Josephson junction; and a back-gate electrode underlying the gate dielectric.

One embodiment of a microwave detector includes: a Josephson junction-based device of the type described above; a microwave source configured to direct one or more microwave photons onto the weak-link region; and a voltage detector configured to measure the voltage across the weak-link region of the Josephson junction.

One embodiment of a method of detecting microwave radiation using the microwave detector described above includes the steps of: providing the Josephson junction in a zero-bias or low-bias state; exposing the Josephson junction to one or more microwave photons, wherein the absorption of the one or more photons induces the Josephson junction to transition from the zero-bias or low-bias state to a higher-voltage state, producing a voltage increase across the Josephson junction; and detecting the voltage increase.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Josephson junctions (JJs) based on bilayers of two-dimensional materials, known as van-der-Waals (vdW) materials, having superconducting phases and integrated weak links are provided. Methods of making the JJs are also provided. Further provided are electronic devices and circuits incorporating the JJs as active components and methods of using the electronic devices and circuits. The JJs are scalable and do not require separate superconducting leads. Examples of electronic devices into which the JJs can be incorporated include microwave devices, such as single-photon detectors. Other devices and circuits into which the JJs can be incorporated include heterodyne or homodyne circuits, or Josephson mixers, superconductor-insulator-superconductor (SIS) quasi-particle mixers, quasi-particle detectors, thermal detectors, transition-edge detectors, superconducting tunnel junction photon and particle detectors, bolometers, micro-calorimeters, oscillators, filters, quantum computing circuits, and superconducting quantum interference devices (SQUIDs).

The JJs are formed from superconducting bilayers having a first superconducting segment and a second superconducting segment separated by a weak-link region. The superconducting bilayers comprise two azimuthally misaligned sheets of a two-dimensional material. The weak-link region is an integral part of the bilayered two-dimensional material, rather than being a separate material inserted between two pieces of the bilayered two-dimensional material.

In their superconducting state, the bilayered superconductors are characterized by a critical current, $I_c$, which is the maximum superconducting current that can flow through the JJ. At currents above $I_c$, superconducting current can no longer flow and the bilayered two-dimensional material acts as a normal material, rather than as a superconductor. Detecting and monitoring this switch from the superconducting state, also referred to as the zero-bias state, to the non-superconducting state, also referred to as the voltage state, by monitoring the voltage change across the junction, can form the basis of a variety of JJ-based electronic devices and applications.

Figure 1:
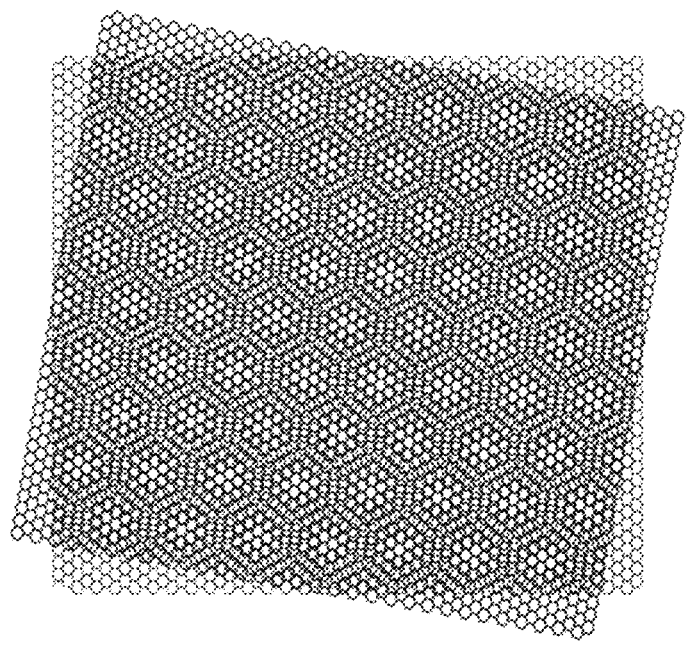
FIG. 1 shows the Moiré pattern formed by two hexagonal two-dimensional lattices that are characteristic of graphene.

The superconducting bilayers include at least two stacked layers of a two-dimensional material. As the term is used herein, a "two-dimensional material" refers to a crystalline solid composed of atomically thin layers in which intralayer atoms are covalently bonded in a crystal lattice and neighboring layers are bonded via interlayer van der vdW attractions. In the superconducting bilayers, the two layers are azimuthally misaligned ("twisted") and this twisting gives rise to a superconducting phase. Twisted-bilayer graphene is an example of a two-dimensional material that can be used as a bilayered superconductor in the JJs. Twisted-bilayer graphene is composed of a pair of layers of the well-known Dirac material graphene, in which the two hexagonal lattices of the two graphene layers are carefully aligned ("twisted") at a 'magic angle' of about 1.1 degrees, to form a Moiré pattern that establishes a superconducting condensate at approximately 1 K. This superconducting state in twisted-BLG is also referred to as tBLG or TBG. Detailed descriptions of TBGs can be found, for example, in Cao et al., Nature 556, 43 (2018); Lu et al., Nature 574, 653 (2019); and Jiang et al., Nature 573, 91 (2019). Graphene is well suited for use in high-frequency JJ devices, because of the very high charge carrier velocity of the quasi-relativistic electrons, the singularity in its density of states, and its thermal properties. However, other bilayered two-dimensional materials in which the layers are bonded by vdW attraction can be used, including twisted bilayers of transition metal dichalcogenides (TMDCs), such as bilayered molybdenum disulfide ($MoS_2$) in its 1T-phase, which exhibits superconductivity at low temperatures, provided that they have a superconducting state. For illustrative purposes, FIG. 1 shows the Moiré pattern that establishes a superconducting condensate in twisted graphene. However, similar Moiré patterns can also establish superconducting condensates for other bilayered two-dimensional materials that exhibit superconductivity, wherein the specific twist angle defines the Moiré pattern and the periodicity of the superlattice.

The weak-link region is a region within the superconducting bilayer where the superconductivity of the two-dimensional material is weakened, such that the weak link has a non-superconducting character. The length of the weak-link region, L (i.e., the dimension between the first superconducting segment and the second superconducting segment), should have dimensions of the coherence length ($L\sim 2\xi$) of the superconducting bilayer, and the weak-link region should alter the superconducting properties of the bilayer without severing it. Weak links meeting these criteria can take on a variety of forms.

One example of an integrated weak link is provided by electrostatic gating. Using this approach, one or more top gate electrodes in combination with one or more bottom gate electrodes having nanoscale dimensions (e.g., dimensions of approximately 20 nm or lower) can be configured to enable tuning of the carrier density in the superconducting bilayer in such a way that superconductivity in the weak-link region of the bilayer is suppressed. The gating is achieved by either one or two gate electrodes capacitively coupled to the TBG from the top and/or the bottom. These electrodes can be formed as linear electrodes with a width of about $\xi$, but can also have zig-zag or curvy shapes. The shape of electrodes has implications for device performance, in particular, the interaction with microwave photons.

Alternatively, focused-ion beam (FIB) writing can be used to introduce a weak link region into the superconducting bilayer. By bombarding a region of the bilayer with energetic ions, such as gallium (Ga) ions, lattice defects can be introduced in the area where the bilayer is bombarded to precisely define a weak-link region.

In other examples of the JJs, the weak-link region is created by introducing a bend, such as a groove or ridge, with a precisely engineered length, L, into an otherwise planar superconducting bilayer. The bend may be directed upward (ridge) or downward (groove) out of the plane of the rest of the superconducting bilayer. By way of illustration, a trench can be defined in a support substrate using, for example, reactive dry etching. When the superconducting bilayer is grown or deposited over the trench, the region of the bilayer suspended over the region will sag into the trench, forming a groove that alters the electron density and mobility in the sheet and provides a weak link. One example of a method that can be used to introduce a groove into a graphene bilayer is to place the graphene on an $SiO_2$ substrate into which grooves with a pitch of several microns have been etched, as described in Timothy A. Lyon, *An Investigation of the g-factor of Graphene*, p. 41, 2017, University of Wisconsin—Madison (dissertation), which is incorporated herein by reference.

While one or more electrostatic gates can be used to form the weak link in the superconducting bilayers, as described above, the one or more electrostatic gates can also be used in combination with Josephson junctions formed by other means, such as concentrated defects and/or a bend, to further define and/or control the Josephson junction.

In order to optimize performance, the bilayers of the two-dimensional materials can be deposited or grown on a carrier mobility enhancing substrate. As the name indicates, a carrier mobility enhancing substrate is a substrate that increases the mobility of the electrons or holes in the superconducting material by improving the quality of the superconducting material by, for example, reducing defects and/or flattening the material. For example, hexagonal boron nitride (hBN) or Ge(001) can be used as a carrier mobility enhancing substrate for TBG or other superconducting bilayers. More information about increased charge transport properties of graphene on Ge(001) and on hBN can be found in Cavallo, Francesca, et al, "Exceptional charge transport properties of graphene on germanium." ACS nano 8.10 (2014): 10237-10245 and Dean, C., et al. "Graphene based heterostructures." *Solid State Communications* 152.15 (2012): 1275-1282, respectively.

The JJs can be incorporated into a variety of devices in which they are switched from a zero-bias state to a voltage state or vice versa. The devices can be back-gated and top-gated in order to tune the carrier density of the bilayer, including the weak-link region, by adjusting the applied gate voltage.

Figure 2:
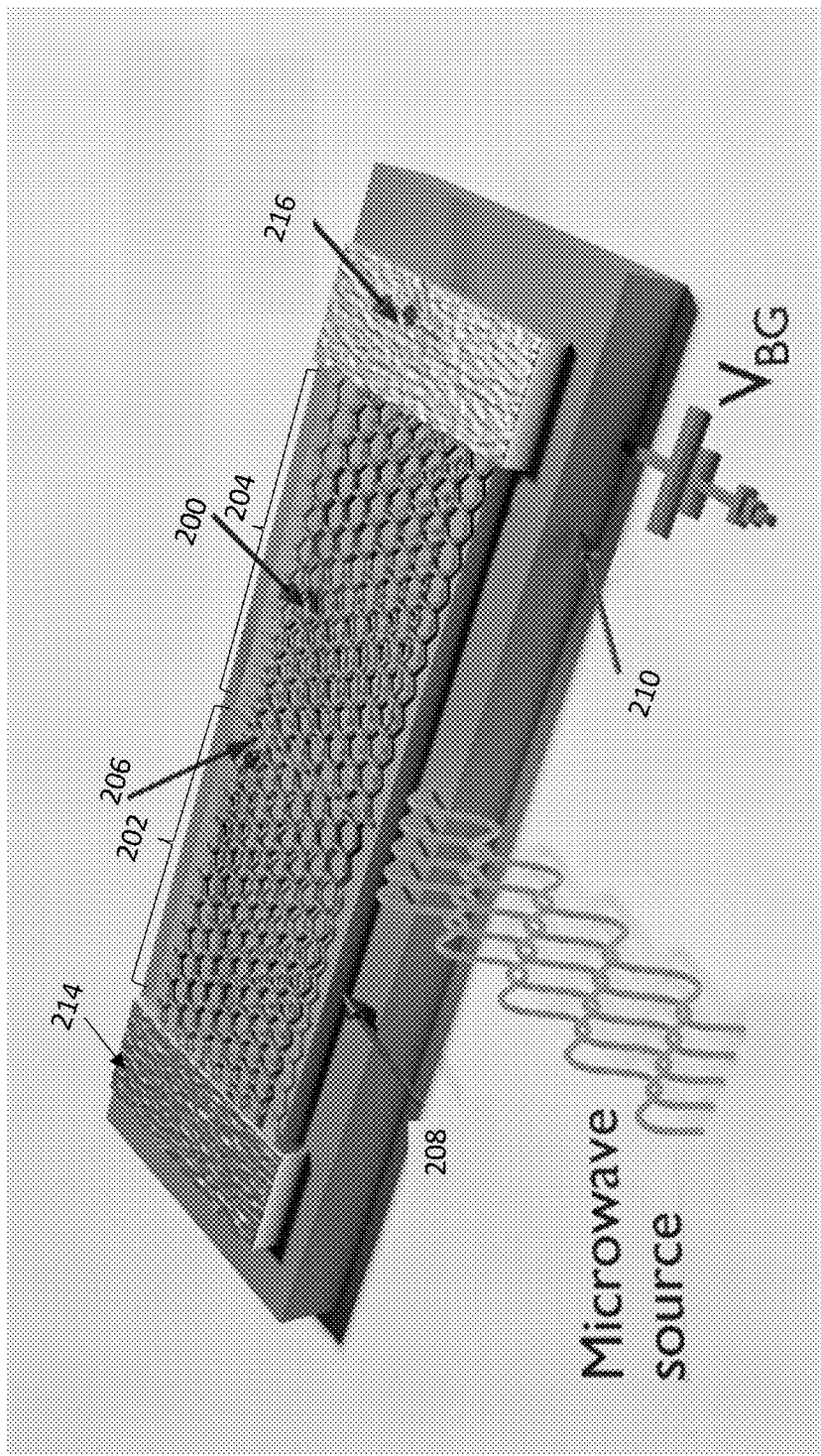
FIG. 2 shows a schematic diagram of a twisted-bilayer graphene Josephson junction (TBG-JJ) incorporated into a microwave circuit. The microwaves (represented by wiggled lines) are coupled to the TBG-JJ, which is placed on a hexagonal-boron-nitride (hBN) layer. The weak link is indicated by the dashed line in the center.

One example of a device into which the Josephson junctions can be incorporated is a microwave detector. A back-gated microwave detector is illustrated schematically in FIG. 2. Although this embodiment of the microwave detector uses TBG as the JJ material, other superconducting bilayers could also be used. In the detector of FIG. 2, the JJ is formed of a strip of TBG 200 that is divided into a first segment 202 and a second segment 204 separated by a weak-link region 206 that is an integral part of the TBG. In the figure, weak-link region 206 is represented generically by a dashed line. The TBG 200 is disposed on a layer of hBN 208, which enhances the carrier mobility in the TBG and acts as a gate dielectric. TBG 200 and hBN 208 are supported on a back-gate electrode 210. Other gate stack configurations can be used. For example, if Ge(001) is used as the carrier mobility enhancing material, the underlying gate stack can comprise a thin dielectric, such as hBN, a thin silicon layer, or aluminum oxide, and an underlying metal gate electrode. Gate electrode 210 is in electrical communication with TBG 200 and is configured to apply a gate voltage ($V_{BG}$) to TBG 200 in order to adjust the carrier density in TBG 200. The detector further includes a first electrode 214 in electrical communication with first segment 202 and a second electrode 216 in electrical communication with second segment 204. The electrodes and TBG segments can be in direct contact or in indirect contact through one or more additional layers of electrically conductive materials. Notably, because the first and second TBG segments are superconducting, first and second electrodes 214 and 216 need not be made of superconducting materials. The TBG can be formed using a mask-aligner as described in the literature. (See, for example, Shaw, Luke, *Modelling, Fabrication and Chatacterisation of Twisted Bilayer Graphene Devices*, (2019), Princeton University (dissertation.) Using these methods, the angle of misalignment (or twist) can be controlled with an accuracy of about 0.1°.

Electrodes can be used to bias the Josephson junction close to its superconducting gap energy. This would then enable not only the variation of the Josephson current, but would also lead to the Josephson junction being operated in a detection mode typically described as photon-assisted-tunneling (PAT) or in a Giaver-fashion (i.e., absorption of two photons breaking up a Cooper-pair).

The microwave detector can be operated by cooling the device below its critical temperature and providing the JJ in a zero-bias or a low bias state and then exposing the JJ to one or more microwave photons that couple to the weak-link region, whereby the interaction between the photon and the JJ causes the JJ to transition from the zero-bias or low-bias state to a high voltage state. This transition produces a voltage pulse across the JJ, which can be detected by a pulse detector connected to the JJ. The JJ can be provided in a zero-bias state by operating the JJ at or below the superconductor critical temperature of the superconducting bilayer and biasing the JJ at a current near, but below, the $I_c$. Alternatively, the JJ can be operated under a low bias in a transition-edge-detection mode by applying a small voltage across the bilayered two-dimensional superconductor, so that it has a small electrical resistance. When a photon is absorbed by the JJ, the $I_c$ is reduced, falling below the bias current, and a detectable voltage pulse is generated across the JJ. A current source connected across the first and second electrode can be used to drive a constant bias current through the JJ, and an amplifier connected to the JJ may be used to amplify the voltage signal before it reaches the voltage detector.

Figure 3:
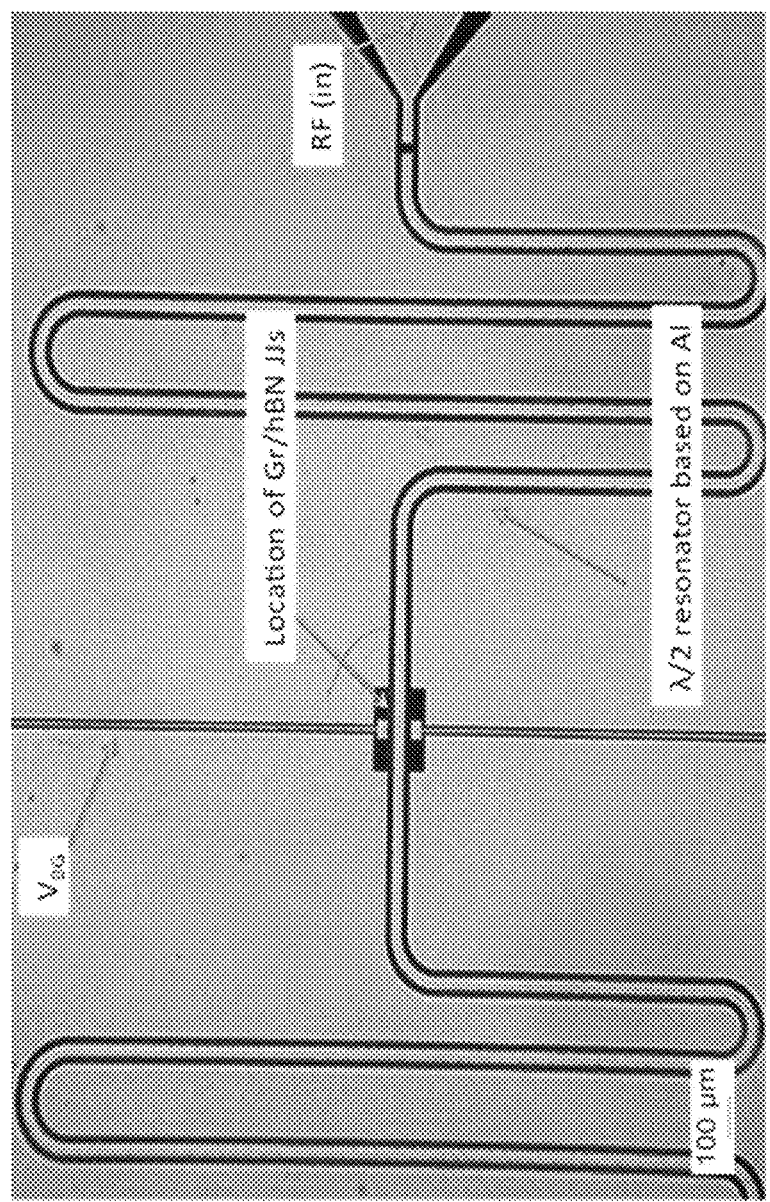
FIG. 3 shows one embodiment of a coplanar waveguide coupled to a TBG-JJ.

The photons detected by the detector may come from microwave radiation propagating in free space or from a microwave source, such as a microwave cavity, that is part of the device. The JJ and its microwave circuit elements can be coupled to (e.g., placed in) a superconducting microwave cavity that is based on a coplanar wave guide (CPW). FIG. 3 illustrates one example of a CPW configuration that can be used. Broadband antennas can be used to couple radiation to the JJs.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A Josephson junction comprising:
   a superconducting bilayer comprising two azimuthally misaligned layers of a two-dimensional material, wherein the superconducting bilayer comprises a first segment and a second segment; and
   a weak-link region separating the first segment from the second segment, wherein the weak-link region has an enhanced concentration of lattice defects relative to the first segment and second segment and is an integral part of the superconducting bilayer.

2. The Josephson junction of claim 1, wherein the weak-link region has a length in the range from 50 μm to 500 μm.

3. The Josephson junction of claim 1, wherein the superconducting bilayer is twisted-bilayer graphene.

4. The Josephson junction of claim 1, wherein the superconducting bilayer is a twisted-bilayer transition metal dichalcogenide.

5. A Josephson junction comprising:
   a superconducting bilayer comprising two azimuthally misaligned layers of a two-dimensional material, wherein the superconducting bilayer comprises a first segment and a second segment; and
   a weak-link region separating the first segment from the second segment, wherein the weak-link region comprises an out-of-plane bend and is an integral part of the superconducting bilayer.

6. The Josephson junction of claim 5, wherein the weak-link region has a length in the range from 50 μm to 500 μm.

7. The Josephson junction of claim 5, wherein the superconducting bilayer is twisted-bilayer graphene.

8. The Josephson junction of claim 5, wherein the superconducting bilayer is a twisted-bilayer transition metal dichalcogenide.

9. A Josephson junction device comprising:
   a Josephson junction comprising
      a superconducting bilayer comprising two azimuthally misaligned layers of a two-dimensional material, wherein the superconducting bilayer comprises a first segment and a second segment; and
      a weak-link region separating the first segment from the second segment, wherein the weak-link region has an enhanced concentration of lattice defects relative to the first segment and second segment and is an integral part of the superconducting bilayer;
   a first electrode in electrical communication with the first segment;
   a second electrode in electrical communication with the second segment;
   a gate dielectric underlying the Josephson junction; and
   a back-gate electrode underlying the gate dielectric.

10. The device of claim 9, wherein the gate dielectric comprises a charge carrier enhancing substrate.

11. The device of claim 10, wherein the charge carrier enhancing substrate comprises hexagonal boron nitride.

12. The device of claim 10, wherein the charge carrier enhancing substrate comprises Ge(001).

13. A Josephson junction device comprising:
   a Josephson junction comprising
      a superconducting bilayer comprising two azimuthally misaligned layers of a two-dimensional material, wherein the superconducting bilayer comprises a first segment and a second segment; and
      a weak-link region separating the first segment from the second segment, wherein the weak-link region comprises an out-of-plane bend and is an integral part of the superconducting bilayer;
   a first electrode in electrical communication with the first segment;
   a second electrode in electrical communication with the second segment;
   a gate dielectric underlying the Josephson junction; and
   a back-gate electrode underlying the gate dielectric.

14. The device of claim 13, wherein the gate dielectric comprises a charge carrier enhancing substrate.

15. The device of claim 14, wherein the charge carrier enhancing substrate comprises hexagonal boron nitride.

16. The device of claim 14, wherein the charge carrier enhancing substrate comprises Ge(001).

17. A microwave detector comprising:
   a Josephson junction device comprising:
      a Josephson junction comprising
         a superconducting bilayer comprising two azimuthally misaligned layers of a two-dimensional material, wherein the superconducting bilayer comprises a first segment and a second segment; and
         a weak-link region separating the first segment from the second segment, wherein the weak-link region has an enhanced concentration of lattice defects relative to the first segment and second segment and is an integral part of the superconducting bilayer;
      a first electrode in electrical communication with the first segment;
      a second electrode in electrical communication with the second segment;
      a gate dielectric underlying the Josephson junction; and
      a back-gate electrode underlying the gate dielectric;
   a microwave source configured to direct one or more microwave photons onto the weak-link region; and
   a voltage detector configured to measure the voltage across the weak-link region of the Josephson junction.

18. A microwave detector comprising:
   a Josephson junction device comprising:
      a Josephson junction comprising
         a superconducting bilayer comprising two azimuthally misaligned layers of a two-dimensional material, wherein the superconducting bilayer comprises a first segment and a second segment; and
         a weak-link region separating the first segment from the second segment, wherein the weak-link region comprises an out-of-plane bend and is an integral part of the superconducting bilayer;
      a first electrode in electrical communication with the first segment;
      a second electrode in electrical communication with the second segment;
      a gate dielectric underlying the Josephson junction; and
      a back-gate electrode underlying the gate dielectric;
   a microwave source configured to direct one or more microwave photons onto the weak-link region; and
   a voltage detector configured to measure the voltage across the weak-link region of the Josephson junction.

* * * * *